US012731770B2

(12) United States Patent
Kim et al.

(10) Patent No.: US 12,731,770 B2
(45) Date of Patent: Sep. 8, 2026

(54) SCRUBBER, SUBSTRATE PROCESSING SYSTEM INCLUDING THE SAME, AND SUBSTRATE PROCESSING METHOD USING THE SAME

(71) Applicant: Samsung Electronics Co., Ltd., Suwon-si (KR)

(72) Inventors: Mukyeong Kim, Suwon-si (KR); Hyun Seok Kim, Suwon-si (KR); Sejin Park, Suwon-si (KR); Hong Jae Kang, Daejeon (KR); Dae-Hoon Lee, Daejeon (KR); Jeongan Choi, Daejeon (KR); Kwan-Tae Kim, Sejong-si (KR); You-Na Kim, Seoul (KR); Hohyun Song, Daejeon (KR); Heesoo Lee, Gwacheon-si (KR); Younghoon Song, Daejeon (KR); Iljeong Heo, Suwon-si (KR)

(73) Assignees: SAMSUNG ELECTRONICS CO., LTD., Suwon-si (KR); Korea Institute of Machinery & Materials, Daejeon (KR)

( * ) Notice: Subject to any disclaimer, the term of this patent is extended or adjusted under 35 U.S.C. 154(b) by 27 days.

(21) Appl. No.: 18/931,884

(22) Filed: Oct. 30, 2024

(65) Prior Publication Data

US 2025/0149314 A1 May 8, 2025

(30) Foreign Application Priority Data

Nov. 3, 2023 (KR) ........................ 10-2023-0150933
Mar. 28, 2024 (KR) ........................ 10-2024-0042772

(51) Int. Cl.
*H01J 37/32* (2006.01)

(52) U.S. Cl.
CPC .. *H01J 37/32844* (2013.01); *H01J 37/32449* (2013.01); *H01J 37/32889* (2013.01);
(Continued)

(58) Field of Classification Search
None
See application file for complete search history.

(56) References Cited

U.S. PATENT DOCUMENTS 5,900,217 A * 5/1999 Hartung .................. F23G 7/065 422/171
7,438,869 B1 * 10/2008 Fabian ..................... F23J 15/02 422/186.04

(Continued)

FOREIGN PATENT DOCUMENTS

KR 10-0623368 B1 9/2006
KR 10-0910875 B1 8/2009

(Continued)

OTHER PUBLICATIONS

Examination Report dated Jan. 10, 2025 from the Korean Patent Office for corresponding Korean Patent Application No. 10-2024-0042772.

*Primary Examiner* — Kenneth B Wells
(74) *Attorney, Agent, or Firm* — Muir Patent Law, PLLC

(57) ABSTRACT

A scrubber may include a plasma processing unit including a plasma generating device and a power generating device, a combustion processing unit including a combustor, which is used to form a flame, a connection conduit connected to the plasma processing unit and spaced apart from the combustion processing unit, and a back-end processing unit connected to the combustion processing unit. The connection conduit may be used to supply a waste gas to the plasma generating device, and the plasma generating device may be configured to form plasma using the waste gas. The plasma and combustion processing units may be configured to (Continued)

provide a first reaction space, in which the plasma is formed, and a second reaction space, in which the flame is formed.

19 Claims, 13 Drawing Sheets

(52) U.S. Cl.
CPC . *H01J 2237/3321* (2013.01); *H01J 2237/334* (2013.01); *H01J 2237/335* (2013.01); *H01J 2237/336* (2013.01)

(56) References Cited

U.S. PATENT DOCUMENTS 7,758,818 B2 7/2010 Lee et al.
8,574,504 B2 11/2013 Kim et al.
2002/0159276 A1* 10/2002 Deboy .............. H02M 3/33507 363/20
2009/0246094 A1* 10/2009 Park ........................ F23G 7/065 422/169
2010/0322827 A1* 12/2010 Gschwandtner ..... B01D 53/323 422/175
2016/0237869 A1 8/2016 Yoon
2022/0134281 A1* 5/2022 Chan ........................ F23M 5/08 422/173

FOREIGN PATENT DOCUMENTS

KR 10-0919619 B1 9/2009
KR 10-2010-0076830 A 7/2010
KR 10-1110888 B1 2/2012
KR 10-1514195 B1 4/2015
KR 10-2015-0058739 A 5/2015
KR 10-2016-0034093 A 3/2016
KR 10-1623476 B1 6/2016
KR 10-1860633 B1 5/2018
KR 10-2089599 B1 3/2020
KR 10-2377982 B1 3/2022
KR 10-2378727 B1 3/2022
KR 10-2432367 B1 8/2022
KR 10-2522762 B1 4/2023

* cited by examiner

SCRUBBER, SUBSTRATE PROCESSING SYSTEM INCLUDING THE SAME, AND SUBSTRATE PROCESSING METHOD USING THE SAME

CROSS-REFERENCE TO RELATED APPLICATIONS

This U.S. non-provisional patent application claims priority under 35 U.S.C. § 119 to Korean Patent Application Nos. 10-2023-0150933 and 10-2024-0042772, filed on Nov. 3, 2023 and Mar. 28, 2024, respectively, in the Korean Intellectual Property Office, the entire contents of which are hereby incorporated by reference.

BACKGROUND OF THE INVENTION

The present disclosure relates to a scrubber, a substrate processing system including the same, and a substrate processing method using the same, and in particular, to a scrubber, which is configured to treat waste gas using at least one of a plasma-based process and a combustion process, a substrate processing system including the same, and a substrate processing method using the same.

A semiconductor device is fabricated through several unit processes. For example, the processes of fabricating the semiconductor device may include a photolithography process, an etching process, and a deposition process, which are performed on a substrate. At the end of each process, it is necessary to safely treat any contaminated gas or liquid used in the process. A scrubber may be used for this purpose. The scrubber may be configured to treat a contamination material, such as volatile organic compounds, fume, and mist and may be called a 'gas absorbing tower'. In addition to absorption of the contaminated gas, the scrubber may be used for distillation, humidification, and removal of dust and mist.

SUMMARY

An embodiment of the inventive concept provides a scrubber, which is configured to treat waste gas using at least one of a plasma-based process and a combustion process, a substrate processing system including the same, and a substrate processing method using the same.

According to an embodiment of the inventive concept, a scrubber may include a chamber, a plasma generator, a power supply, a combustor configured to form a flame, and a connection conduit connected to the plasma generator and configured to supply a waste gas to the plasma generator. The plasma generator may be configured to form plasma in the chamber using the waste gas. The plasma generator may be configured to provide a first reaction space in the chamber in which the plasma is formed, and the combustor may be configured to provide a second reaction space in the chamber in which the flame is formed.

According to another embodiment of the inventive concept, a scrubber may include a plasma processing unit including a plasma generating device and a power generating device, a combustion processing unit including a combustor, which is used to form a flame, a connection conduit connected to the plasma processing unit and spaced apart from the combustion processing unit, and a back-end processing unit connected to the combustion processing unit. The connection conduit may be used to supply a waste gas to the plasma generating device, and the plasma generating device may be configured to form plasma using the waste gas. The plasma and combustion processing units may be configured to provide a first reaction space, in which the plasma is formed, and a second reaction space, in which the flame is formed.

According to an embodiment of the inventive concept, a substrate processing system may include a substrate processing apparatus, a vacuum pump connected to the substrate processing apparatus, a scrubber connected to the vacuum pump, a vacuum conduit connecting the substrate processing apparatus to the vacuum pump, and a connection conduit connecting the vacuum pump to the scrubber. The scrubber may include a chamber, a plasma generator coupled to the connection conduit and a combustor. The plasma generator may be used to generate plasma, and the combustor may be used to produce a flame. The scrubber may be configured to provide a first reaction space in the chamber in which the plasma is generated, and the combustor may be configured to provide a second reaction space in the chamber in which the flame is produced. A portion of the first reaction space and a portion of the second reaction space may be overlapped with each other.

According to another embodiment of the inventive concept, a substrate processing system may include a substrate processing apparatus, a vacuum pump connected to the substrate processing apparatus, a scrubber connected to the vacuum pump, a vacuum conduit connecting the substrate processing apparatus to the vacuum pump, and a connection conduit connecting the vacuum pump to the scrubber. The scrubber may include a plasma processing unit coupled to the connection conduit and a combustion processing unit connected to the plasma processing unit. The plasma processing unit may include a plasma generating device, which is used to generate plasma, and the combustion processing unit may include a combustor, which is used to produce a flame. The scrubber may be configured to provide a first reaction space, in which the plasma is generated, and a second reaction space, in which the flame is produced. A portion of the first reaction space and a portion of the second reaction space may be overlapped with each other.

According to an embodiment of the inventive concept, a substrate processing method may include preparing a substrate in a substrate processing apparatus, processing the substrate, and treating a waste gas exhausted from the substrate processing apparatus. Treating the waste gas may be performed by a scrubber including a plasma generator and a combustor. Treating the waste gas may include treating the waste gas using at least one of the plasma generator and the combustor.

According to another embodiment of the inventive concept, a substrate processing method may include preparing a substrate in a substrate processing apparatus, processing the substrate, and treating a waste gas exhausted from the substrate processing apparatus. The treating of the waste gas may be performed by a scrubber including a plasma processing unit and a combustion processing unit. The treating of the waste gas may include treating the waste gas using at least one of the plasma and combustion processing units.

DETAILED DESCRIPTION

Example embodiments of the inventive concepts will now be described more fully with reference to the accompanying drawings, in which example embodiments are shown.

Figure 1:
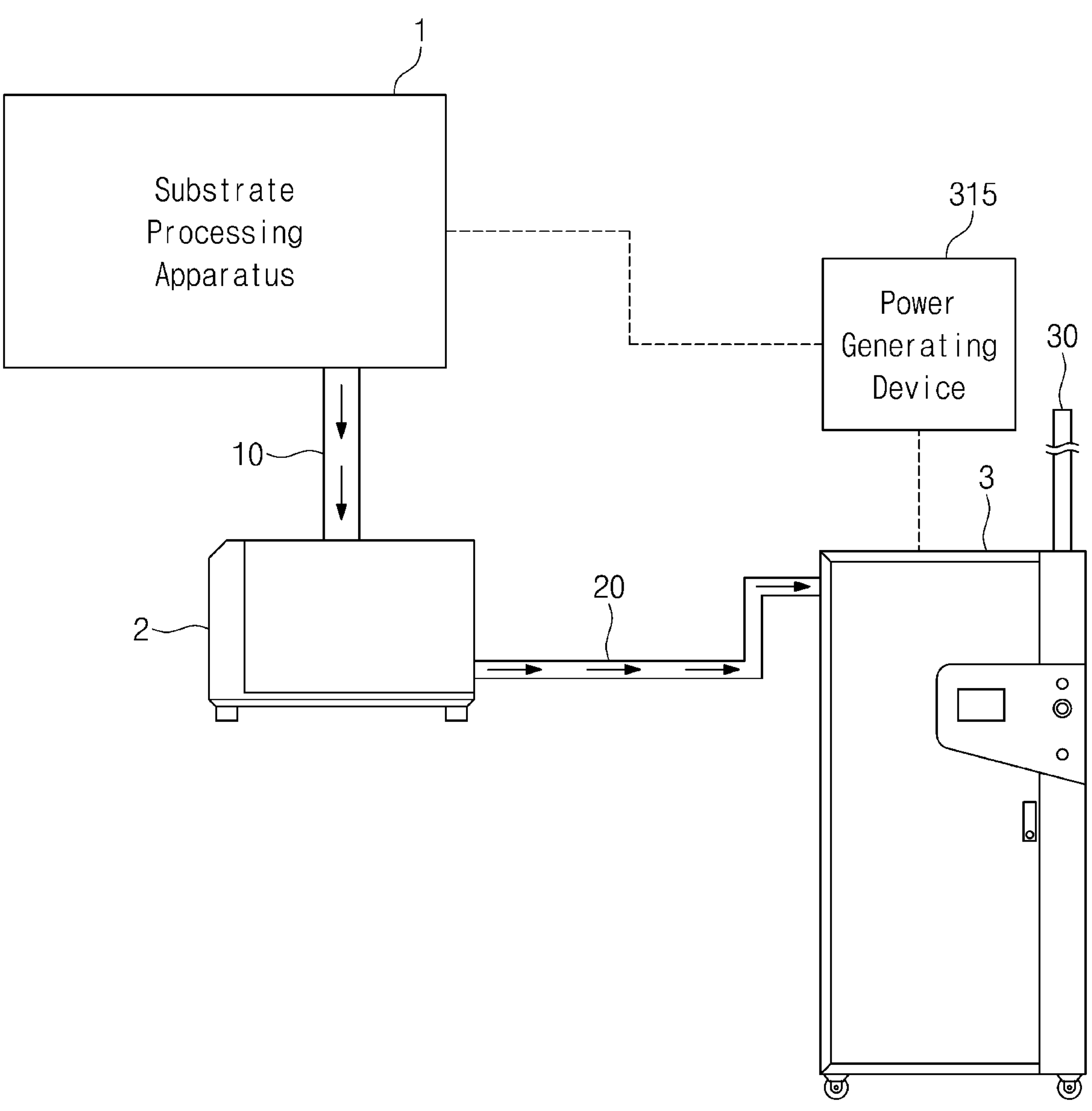
FIG. 1 is a schematic diagram illustrating a substrate processing system according to an embodiment of the inventive concept.

FIG. 1 is a schematic diagram illustrating a substrate processing system according to an embodiment of the inventive concept.

Referring to FIG. 1, a substrate processing system may be provided. The substrate processing system may include a substrate processing apparatus 1, a vacuum pump 2, and a scrubber 3.

The substrate processing apparatus 1 may be configured to perform a fabrication process on a substrate. More specifically, the substrate processing apparatus 1 may be configured to perform a semiconductor fabrication process (e.g., a photolithography process, an etching process, a deposition process, or a cleaning process). In the present specification, the substrate may refer to, for example, an initial substrate such as a silicon wafer, and/or such an initial substrate with additional layers formed thereon (e.g., patterned insulating and conductive layers).

During the fabrication process, various fluids may be supplied to the substrate processing apparatus 1 and may be used to treat the substrate. The fluids may include gases and liquids. The fluid may be discharged from the substrate processing apparatus 1, after the fabrication process. For example, the fluid, which is discharged from the substrate processing apparatus 1, may include waste gas.

A vacuum conduit 10 may be provided between the substrate processing apparatus 1 and the vacuum pump 2. The vacuum conduit 10 may be connected to both the substrate processing apparatus 1 and the vacuum pump 2. For example, the vacuum conduit 10 may connect the substrate processing apparatus 1 to the vacuum pump 2. In an embodiment, the vacuum conduit 10 may be maintained to be in a vacuum pressure state.

The vacuum pump 2 may be connected to the substrate processing apparatus 1 through the vacuum conduit 10. The vacuum pump 2 may be used to remove the used fluid from the substrate processing apparatus 1. For example, the waste gas, which is discharged from the substrate processing apparatus 1, may be transferred to the vacuum pump 2 through the vacuum conduit 10. Thus, the fluid may be evacuated from an inner space of the substrate processing apparatus 1, and an internal pressure of the substrate processing apparatus 1 may be maintained to be in a substantial vacuum state. For example, the vacuum pump 2 may include at least one of a turbomolecular pump (TMP) or a roughing pump.

A connection conduit 20 may be provided between the vacuum pump 2 and the scrubber 3. The connection conduit 20 may be connected to both the vacuum pump 2 and the scrubber 3. For example, the connection conduit 20 may connect the vacuum pump 2 to the scrubber 3. Unlike the vacuum conduit 10, the connection conduit 20 may be maintained to be in an atmospheric pressure state, but the inventive concept is not limited to this example.

The scrubber 3 may be connected to the vacuum pump 2 through the connection conduit 20. The fluid, which is used in the substrate processing apparatus 1, may be transferred to the scrubber 3 through the vacuum conduit 10, the vacuum pump 2, and the connection conduit 20. The scrubber 3 may be configured to treat a contamination material (e.g., volatile organic compounds, fume, and mist). For example, the scrubber 3 may be used to treat waste gas exhausted from the substrate processing apparatus 1. For example, the waste gas may include perfluorinated compounds (e.g., carbon tetrafluoride ($CF_4$), sulfur hexafluoride ($SF_6$), and nitrogen trifluoride ($NF_3$)).

The scrubber 3 may further include a power generating device 315 (e.g., a power supply or power source). The power generating device 315 may be connected to the scrubber 3 and the substrate processing apparatus 1. For example, the power generating device 315 may be responsive to an electrical signal transmitted from the substrate processing apparatus 1. The power generating device 315 may be controlled by the substrate processing apparatus 1. Hereinafter, the scrubber 3 will be described in more detail with reference to FIG. 2.

Figure 2:
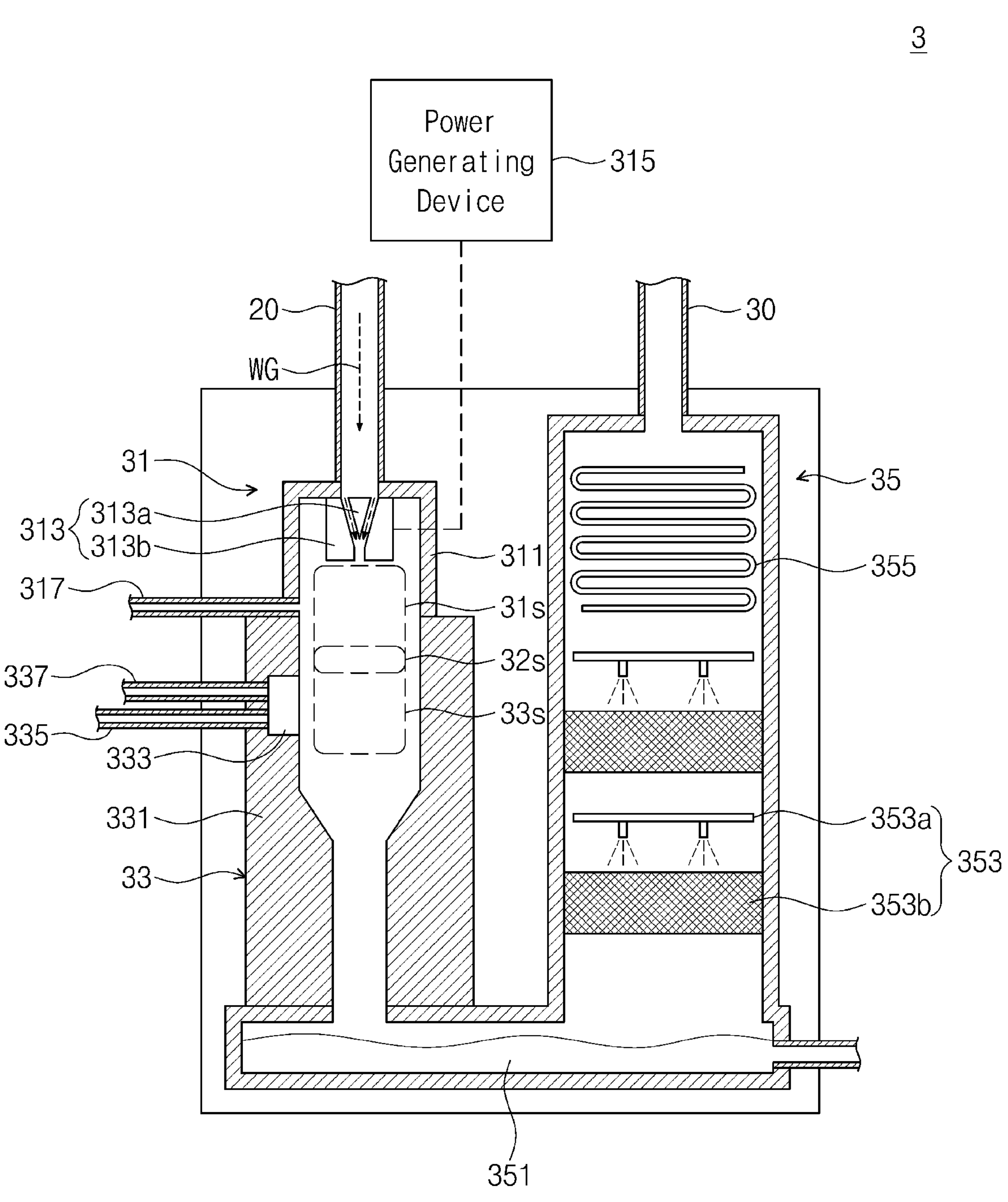
FIGS. 2 and 3 are sectional views illustrating a scrubber according to an embodiment of the inventive concept.
Figure 3:
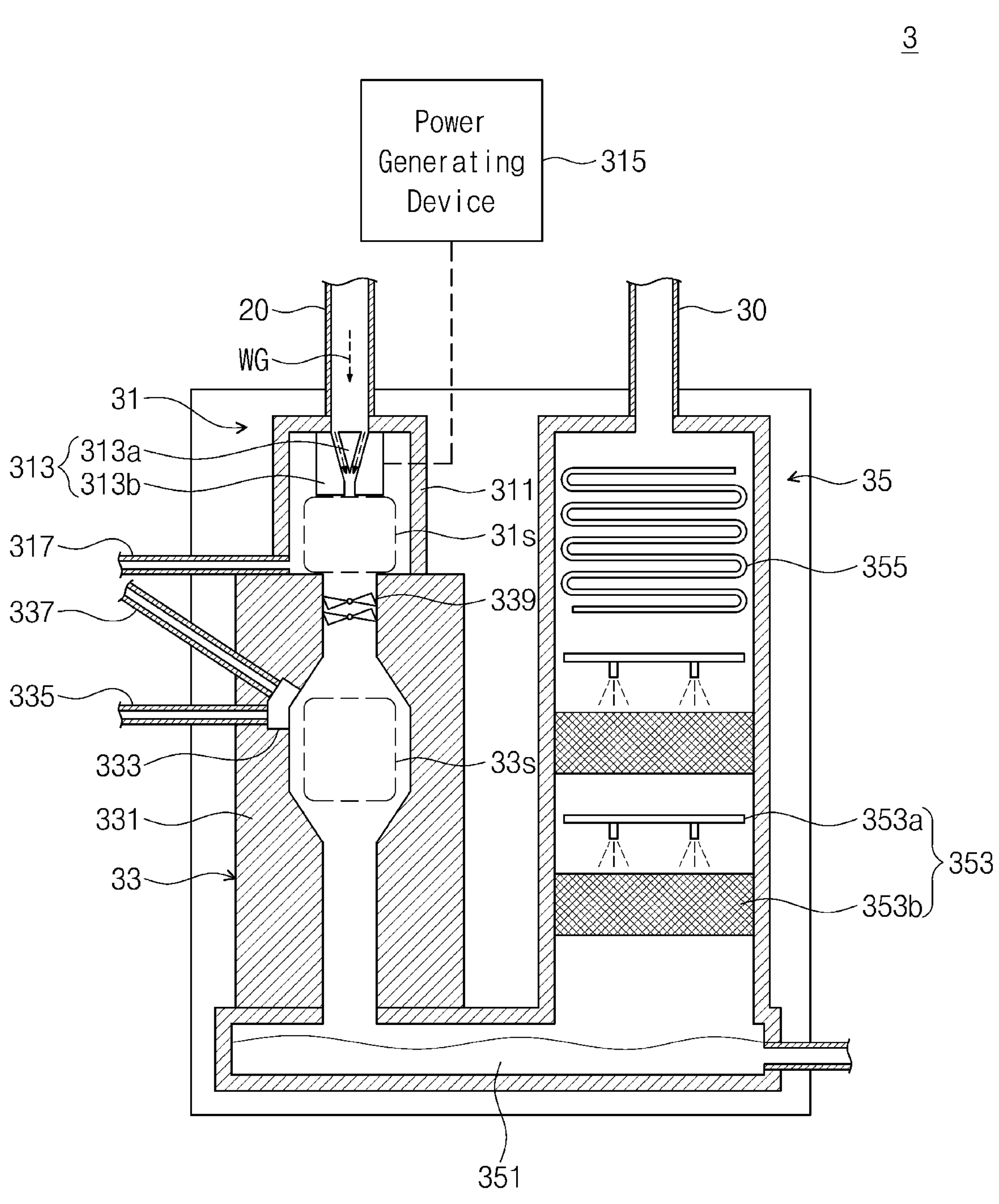

FIGS. 2 and 3 are sectional views illustrating a scrubber according to an embodiment of the inventive concept.

Referring to FIG. 2, the scrubber 3 may include a plasma processing unit 31, a combustion processing unit 33, and a back-end processing unit 35. In some examples, the scrubber 3 can be a hybrid scrubber that can operate in a plasma mode, a combustion mode, and/or a combination of these modes. An inhibitor supplying pipe 317 (e.g., inhibitor supply pipe) may be provided between the plasma and combustion processing units 31 and 33. The plasma and combustion processing units 31 and 33 may decompose waste gas WG that is exhausted from the substrate processing apparatus 1 of FIG. 1. For example, the plasma and combustion processing units 31 and 33 may constitute a front-end processing unit.

The plasma processing unit 31 may be placed in an upper region of the scrubber 3. The plasma processing unit 31 may be connected to the connection conduit 20. The plasma processing unit 31 may include a plasma chamber 311, a plasma generating device 313 (e.g., a plasma generator), and the power generating device 315 (e.g., a power supply or power source).

The plasma chamber 311 may be connected and coupled to the connection conduit 20. The connection conduit 20 may be used to supply the waste gas WG, which is exhausted from the substrate processing apparatus 1 of FIG. 1, to the plasma processing unit 31. More specifically, the connection conduit 20 may be directly connected to the plasma generating device 313. Thus, the waste gas WG may be supplied into the plasma generating device 313.

The inhibitor supplying pipe 317 may be located between the plasma and combustion processing units 31 and 33. The inhibitor supplying pipe 317 may be connected and coupled to the plasma processing unit 31 or the combustion processing unit 33. A recombination inhibitor may be provided through the inhibitor supplying pipe 317. The recombination inhibitor may prevent the waste gas, which is decomposed by the plasma, from being re-coupled to each other. For example, the recombination inhibitor may include steam ($H_2O$) and/or hydrogen ($H_2$).

The plasma generating device 313 may be placed in an upper region of the plasma processing unit 31. The waste gas WG may be supplied to the plasma generating device 313 from the connection conduit 20. The plasma generating device 313 may include a first electrode 313*a* and a second electrode 313*b*. The first and second electrodes 313*a* and 313*b* may be spaced apart from each other. For example, the waste gas WG may be supplied into a space between the first and second electrodes 313*a* and 313*b*.

The plasma generating device 313 may be connected to the power generating device 315. An electric power may be supplied to the plasma generating device 313 from the power generating device 315. For example, the first and second electrodes 313*a* and 313*b* of the plasma generating device 313 may produce an electric field using the electric power supplied from the power generating device 315. The electric field, which is produced by the first and second electrodes 313*a* and 313*b*, may be used to ionize a portion of the waste gas WG. Thus, the plasma generating device 313 may be used to produce plasma. For example, the waste gas WG may be a source material of the plasma and may be decomposed by the plasma. For example, an electric power, which is supplied to the plasma generating device 313 from the power generating device 315, may range from about 0.5 kW to about 15.0 kW.

For example, the plasma generating device 313 (e.g., plasma generator) may include an arc plasma device using an electric arc generated by a current between two electrodes, a gliding arc plasma device using an electric arc generated in an elongated shape, a dielectric barrier discharge plasma device using an electric discharging phenomenon through an insulating material between electrodes, a microwave plasma device using an electromagnetic wave, a pulsed corona discharge plasma device using a pulse voltage, an inductively-coupled plasma (ICP) device using a high frequency current, and a capacitively coupled plasma (CCP) device using an electric capacitance between electrodes. For example, the plasma, which is generated by the plasma generating device 313, may be arc plasma, gliding arc plasma, dielectric barrier discharge plasma, microwave plasma, pulsed corona discharge plasma, inductively coupled plasma, and/or capacitively coupled plasma, but the inventive concept is not limited to this example.

In an embodiment, the waste gas WG may include nitrogen trifluoride ($NF_3$), and the recombination inhibitor may include water ($H_2O$) supplied in liquid or gaseous form. In this case, the reactivity of the waste gas WG may be increased by the plasma, and the waste gas WG may be chemically reacted with the recombination inhibitor. Thus, nitrogen oxide ($NO_x$) and hydrofluoric acid (HF) may be produced.

In an embodiment, the waste gas WG may include nitrogen trifluoride ($NF_3$), and the recombination inhibitor may include hydrogen ($H_2$). In this case, since the recombination inhibitor does not include oxygen atoms, nitrogen oxide ($NO_x$) may not be produced. Thus, it may be possible to efficiently suppress or reduce the production of nitrogen oxide ($NO_x$).

As a result, the waste gas WG may include fluorine atoms, and the recombination inhibitor may include hydrogen atoms. When a sufficient amount of the recombination inhibitor is provided, it may be possible to effectively decompose the waste gas WG, without the recombination issue of the waste gas. Thus, the recombination inhibitor may be provided such that a ratio between the number of fluorine (F) atoms in the waste gas WG and the number of hydrogen (H) atoms in the recombination inhibitor is within a range of about 1:1 to about 1:10.

The combustion processing unit 33 may be placed below the plasma processing unit 31 or at a back end of the plasma processing unit 31. The plasma processing unit 31 may be coupled to a top or front end of the combustion processing unit 33. The combustion processing unit 33 may be placed between the plasma processing unit 31 and the back-end processing unit 35 to connect the plasma processing unit 31 to the back-end processing unit 35. The combustion processing unit 33 may include a reaction chamber 331, a combustor 333, a fuel supplying pipe 335 (e.g., fuel supply pipe), and an air supplying pipe 337 (e.g., air supply pipe). For example, the plasma chamber 311 and reaction chamber 331 may constitute a chamber of the scrubber 3.

The reaction chamber 331 may be connected to each of the fuel supplying pipe 335 and the air supplying pipe 337. The fuel supplying pipe 335 and the air supplying pipe 337 may be spaced apart from each other, but the inventive concept is not limited to this example. For example, the fuel supplying pipe 335 and the air supplying pipe 337 may be provided to penetrate a portion of the reaction chamber 331 and may be coupled to the combustor 333.

The fuel and the air may be supplied to the combustor 333 through the fuel supplying pipe 335 and the air supplying pipe 337. The combustor 333 may be configured to produce a flame using the fuel and the air. For example, the waste gas WG may be pyrolyzed and/or combusted using the flame, which is produced by the combustor 333. For example, the fuel may include a liquefied natural gas (LNG) and methane ($CH_4$) or may include a non-hydrocarbon material (e.g., hydrogen ($H_2$) and ammonia ($NH_3$)). The air may include oxygen ($O_2$).

In an embodiment, the waste gas WG may include nitrogen trifluoride ($NF_3$), and the fuel may include methane ($CH_4$). In this case, the nitrogen trifluoride ($NF_3$) may be pyrolyzed and/or combusted to produce nitrogen oxide ($NO_x$), hydrofluoric acid (HF), water ($H_2O$), and carbon monoxide (CO). The produced water ($H_2O$) may be used as a recombination inhibitor of the plasma processing unit 31. Thus, it may be possible to omit the inhibitor supplying pipe 317, which is used to supply the recombination inhibitor.

In another embodiment, the waste gas WG may include nitrogen trifluoride ($NF_3$), and the fuel may include a non-hydrocarbon material (e.g., hydrogen ($H_2$) and ammonia ($NH_3$)). In this case, the nitrogen trifluoride ($NF_3$) may be pyrolyzed and/or combusted to produce hydrofluoric acid (HF), nitrogen ($N_2$), and water ($H_2O$), but carbon monoxide (CO) may not be produced. For example, if a sufficient amount of ammonia ($NH_3$) is supplied, a portion of the ammonia ($NH_3$) may not be combusted and thus may remain. In this case, the nitrogen ($N_2$) and the water ($H_2O$) may be produced through a chemical reaction between the remaining portion of the ammonia ($NH_3$) and the nitrogen oxide ($NO_x$), which is produced in the plasma processing unit 31. Accordingly, the nitrogen oxide ($NO_x$), which is produced in the plasma processing unit 31, may be removed without an additional treating device.

The plasma chamber 311 of the plasma processing unit 31 and the reaction chamber 331 of the combustion processing unit 33 may be configured to provide a first reaction space 31*s*, a second reaction space 33*s*, and a mixed reaction space 32*s*. The mixed reaction space 32*s* may be a region where a portion of the first reaction space 31*s* and a portion of the second reaction space 33*s* overlap with each other (e.g., where reactions of both the first reaction space 31*s* and the second reaction space 33*s* may occur) For example, a lower portion of the first reaction space 31*s* and an upper portion of the second reaction space 33*s* may be overlapped with each other. The first reaction space 31*s* may be a space in which the plasma is generated by the plasma generating device 313. The second reaction space 33*s* may be a space in which the flame is produced by the combustor 333. The mixed reaction space 32*s* may be a space in which the plasma produced by the plasma generating device 313 and the flame produced by the combustor 333 are simultaneously provided (e.g., a space where the plasma and flame may coexist). In some examples, the mixed reaction space 32*s* may be a space in which the waste gas WG is treated by both the plasma and the flame.

The back-end processing unit 35 may be placed below the combustion processing unit 33 or at a back end of the combustion processing unit 33. The back-end processing unit 35 may be configured to treat a toxic gas, which is produced when the waste gas WG is decomposed in the plasma processing unit 31 and/or combustion processing unit 33. The toxic gas may include, for example, nitrogen oxide ($NO_x$), hydrofluoric acid (HF), and carbon monoxide (CO). The back-end processing unit 35 may include a waste water processing device 351, a wet processing device 353, and/or a heat-exchanging cooling device 355.

The waste water processing device 351 may be placed at a level lower than the wet processing device 353 and the heat-exchanging cooling device 355. The waste water processing device 351 may be used to temporarily store waste water. The waste water may be produced when the toxic gas is dissolved in cooling water (or other water used during manufacturing). The waste water processing device 351 may exhaust the waste water to the outside through an external conduit.

The wet processing device 353 may be placed on the waste water processing device 351. The wet processing device 353 may include a spray module 353*a* (e.g., one or more sprayers) and an absorption structure 353*b*. The spray module 353*a* may be configured to spray cooling water. The absorption structure 353*b* may be configured to increase a contact area between the sprayed cooling water and the toxic gas and thereby to increase the reactivity therebetween. Due to the high dissolvability of the toxic gas in the cooling water, the toxic gas may be removed by the wet processing device 353. In an embodiment, a plurality of spray modules 353*a* and a plurality of absorption structures 353*b* may be provided. The heat-exchanging cooling device 355 (e.g., a heat exchanger) may be placed on the wet processing device 353. The heat-exchanging cooling device 355 may have various shapes (e.g., U- or S-shaped section), and in this case, it may be possible to increase a contact area between the heat-exchanging cooling device 355 and the toxic gas. A cooling water may flow through the heat-exchanging cooling device 355. Thus, the toxic gas may be cooled below its dew point and may be in a liquid state. Accordingly, the heat-exchanging cooling device 355 may be configured to liquefy and remove the toxic gas. An exhausting pipe 30 may be connected to a back-end of the back-end processing unit 35. The fluid, which does not include the toxic gas, may be safely exhausted to the outside through the exhausting pipe 30.

In an embodiment, the wet processing device 353 may be placed on the heat-exchanging cooling device 355. In addition, the back-end processing unit 35 may include only the wet processing device 353 or may include only the heat-exchanging cooling device 355. Accordingly, in some examples, the back-end processing unit 35 may include only one of the wet processing device 353 and the heat-exchanging cooling device 355.

Referring to FIG. 3, the plasma chamber 311 of the plasma processing unit 31 may be configured to define the first reaction space 31*s*. The reaction chamber 331 of the combustion processing unit 33 may be configured to define the second reaction space 33*s*. The first and second reaction spaces 31*s* and 33*s* may be spaced apart from each other. In an example, if the first and second reaction spaces 31*s* and 33*s* are not overlapped with each other, the mixed reaction space 32*s* of FIG. 2 may not be provided.

In this case, the waste gas WG may first be treated by the plasma processing unit 31 of the scrubber 3 and then may be treated by the combustion processing unit 33. For example, in the first reaction space 31*s*, the waste gas WG may be decomposed by the plasma. A portion of the waste gas WG may not be decomposed by the plasma. Nevertheless, even if the waste gas WG is not decomposed, the reactivity of the waste gas WG may be increased by the plasma. Thus, in the second reaction space 33*s*, the remaining portion of the waste gas WG may be easily decomposed by the flame after plasma treatment.

The scrubber 3 may further include a baffle 339 that is located between the first and second reaction spaces 31*s* and 33*s*. For example, the baffle 339 may be closer to the first reaction space 31*s* than to the second reaction space 33*s*. The baffle 339 may be used to vary the flow rate of the waste gas WG. In addition, the baffle 339 may be used to trap the waste gas WG in the first reaction space 31*s*. In this case, it may be possible to prevent the waste gas WG from being prematurely transferred to the second reaction space 33*s*, before it is sufficiently decomposed by the plasma.

Referring to FIGS. 2 and 3, the scrubber 3 may include the plasma and combustion processing units 31 and 33. The plasma processing unit 31 may be configured to treat the waste gas WG using the plasma. The combustion processing unit 33 may be configured to treat the waste gas WG using the flame. In some examples, the waste gas WG may be treated using both the plasma and the flame. Thus, the scrubber 3 can be a hybrid scrubber, and depending on the kind of the waste gas WG, the plasma and/or the flame may be selectively used to efficiently treat the waste gas WG.

According to an embodiment of the inventive concept, the plasma generating device 313 of the scrubber 3 may generate the plasma using the waste gas WG. Thus, the plasma generating device 313 may be operated with a relatively low electric power (e.g., about 0.5 kW to about 15.0 kW). In addition, an inert gas (e.g., argon (Ar) and/or nitrogen ($N_2$)) may not be needed to generate the plasma. Thus, it may be possible to reduce the costs required to treat the waste gas WG.

Figure 4:
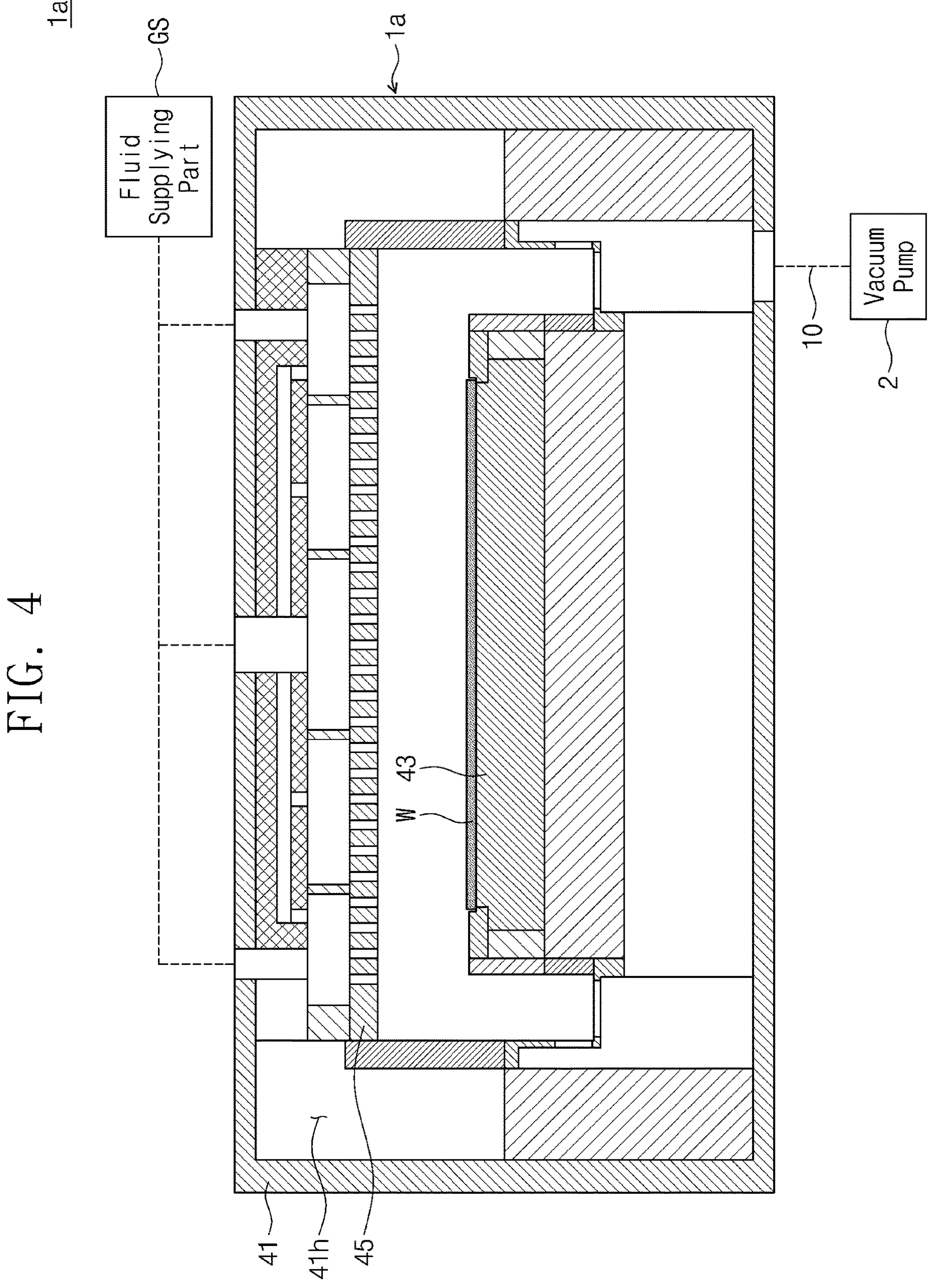
FIGS. 4 to 6 are sectional views illustrating a substrate processing apparatus according to an embodiment of the inventive concept.
Figure 5:
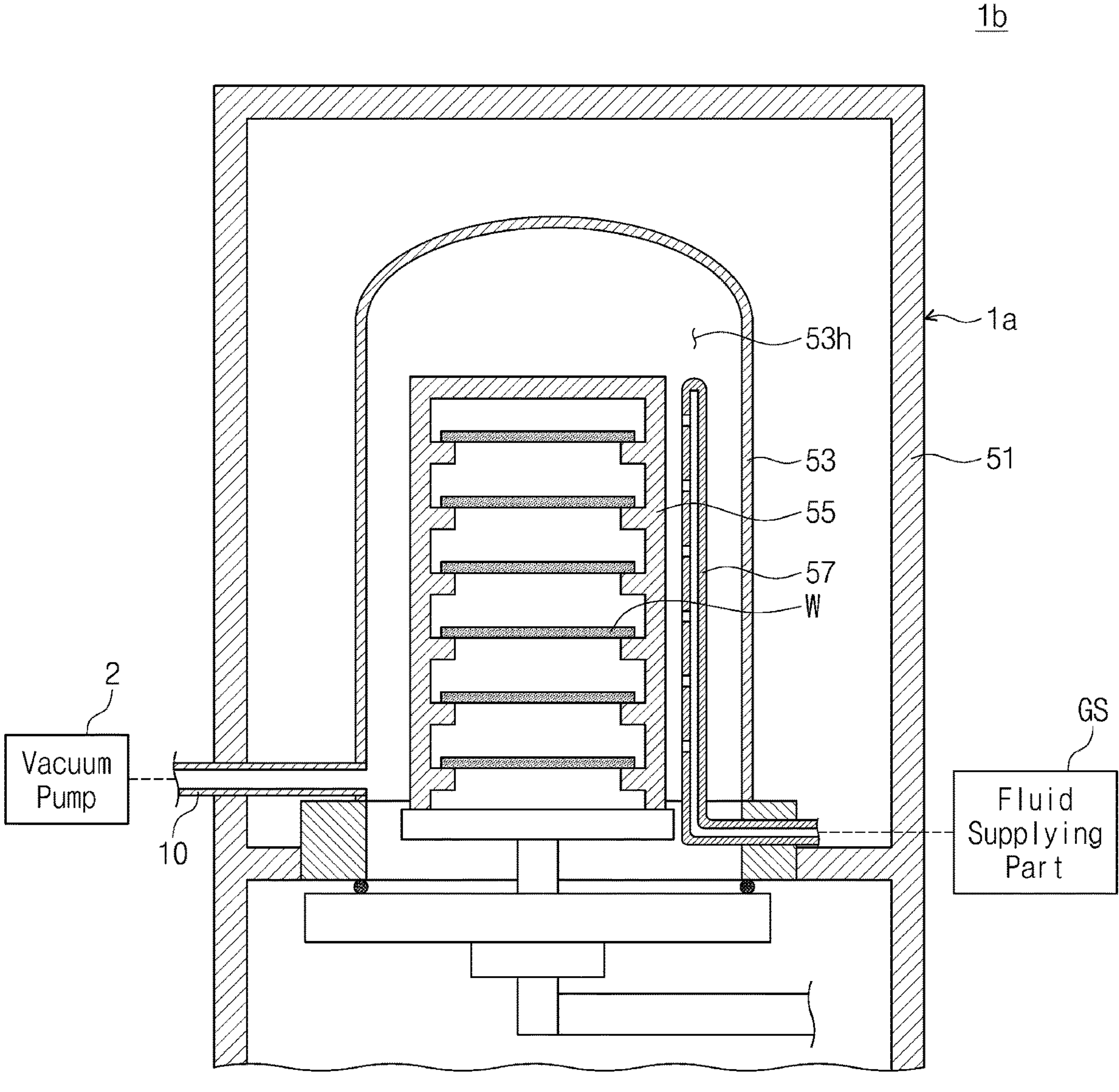
Figure 6:
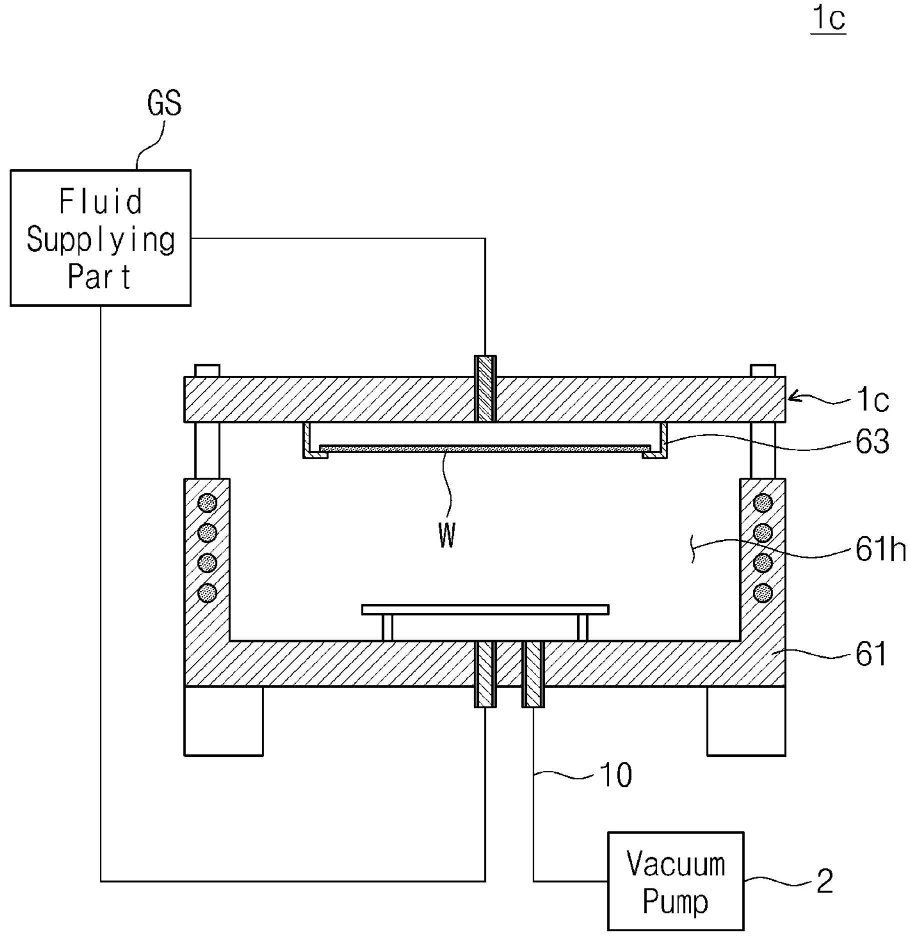

FIGS. 4 to 6 are sectional views illustrating a substrate processing apparatus according to an embodiment of the inventive concept.

Referring to FIG. 4, a substrate processing apparatus 1*a* according to an embodiment of the inventive concept may be an etching apparatus, which is used to perform an etching process using plasma. In this case, the substrate processing apparatus 1*a* may include an etching chamber 41, an electrostatic chuck 43, a shower head 45, and a fluid supplying part GS.

The etching chamber 41 may be configured to define an etching space 41*h* (e.g., an etching chamber). The etching space 41*h* may be a space in which a semiconductor fabrication process can be performed. The electrostatic chuck 43 may be placed in the etching space 41*h*. A substrate W may be loaded on and fastened by the electrostatic chuck 43. The etching space 41*h* may be connected to the vacuum pump 2 through the vacuum conduit 10. The vacuum pump 2 may be used to remove a fluidic material from the etching space 41*h*, and in this case, the etching space 41*h* may be maintained in a vacuum pressure state.

The fluid supplying part GS may be used to supply a fluidic material. The fluidic material, which is supplied from the fluid supplying part GS, may be transferred to the etching space 41*h* through the shower head 45. Waste gas, which is produced after a semiconductor fabrication process (e.g., an etching process) in the etching space 41*h*, may be discharged to the vacuum pump 2 through the vacuum conduit 10.

Referring to FIG. 5, a substrate processing apparatus 1*b* according to an embodiment of the inventive concept may be a deposition apparatus, which is configured to perform a deposition process using a fluidic material. In this case, the substrate processing apparatus 1*b* may include a deposition chamber 51, a reaction tube 53, a stage 55, a gas nozzle 57, and the fluid supplying part GS.

The reaction tube 53 may be configured to define a deposition space 53*h*. The deposition space 53*h* may be a space, in which a semiconductor fabrication process can be performed. The stage 55 and the gas nozzle 57 may be placed in the deposition space 53*h*. A plurality of substrates W may be spaced apart from each other in the stage 55. The deposition space 53*h* may be connected to the vacuum pump 2 through the vacuum conduit 10. The vacuum pump 2 may be used to remove the fluidic material from the deposition space 53*h*, and in this case, the deposition space 53*h* may be maintained in a vacuum pressure state.

The fluid supplying part GS may be used to supply a fluidic material. The fluid supplying part GS may be connected to the gas nozzle 57. The fluidic material, which is supplied from the fluid supplying part GS, may be transferred to the deposition space 53*h* through the gas nozzle 57. If the semiconductor fabrication process (e.g., the deposition process) in the deposition space 53*h* is finished, a waste gas produced may be transferred to the vacuum pump 2 through the vacuum conduit 10.

Referring to FIG. 6, a substrate processing apparatus 1*c* according to an embodiment of the inventive concept may be a cleaning apparatus, which is configured to perform a cleaning process using a fluidic material. In this case, the substrate processing apparatus 1*c* may include a cleaning chamber 61, a cleaning stage 63, and the fluid supplying part GS.

The cleaning chamber 61 may be configured to define a cleaning space 61*h* (e.g., a cleaning chamber). The cleaning space 61*h* may be a space, in which a semiconductor fabrication process can be performed. The cleaning stage 63 may be placed in the cleaning space 61*h*. The substrate W may be disposed on the cleaning stage 63. The cleaning space 61*h* may be connected to the vacuum pump 2 through the vacuum conduit 10. The vacuum pump 2 may be used to remove the fluidic material from the cleaning space 61*h*, the cleaning space 61*h* may be maintained to a vacuum pressure state.

The fluid supplying part GS may be used to supply a fluidic material. The fluid supplying part GS may be connected to upper and lower portions of the cleaning chamber 61. The fluidic material, which is supplied from the fluid supplying part GS, may be transferred to the substrate W on the cleaning stage 63. For example, the fluidic material may be carbon dioxide ($CO_2$) in a supercritical fluid (SCF) state. Waste gas, which is produced after a semiconductor fabrication process (e.g., a cleaning process) in the cleaning space 61*h*, may be discharged to the vacuum pump 2 through the vacuum conduit 10.

Figure 7:
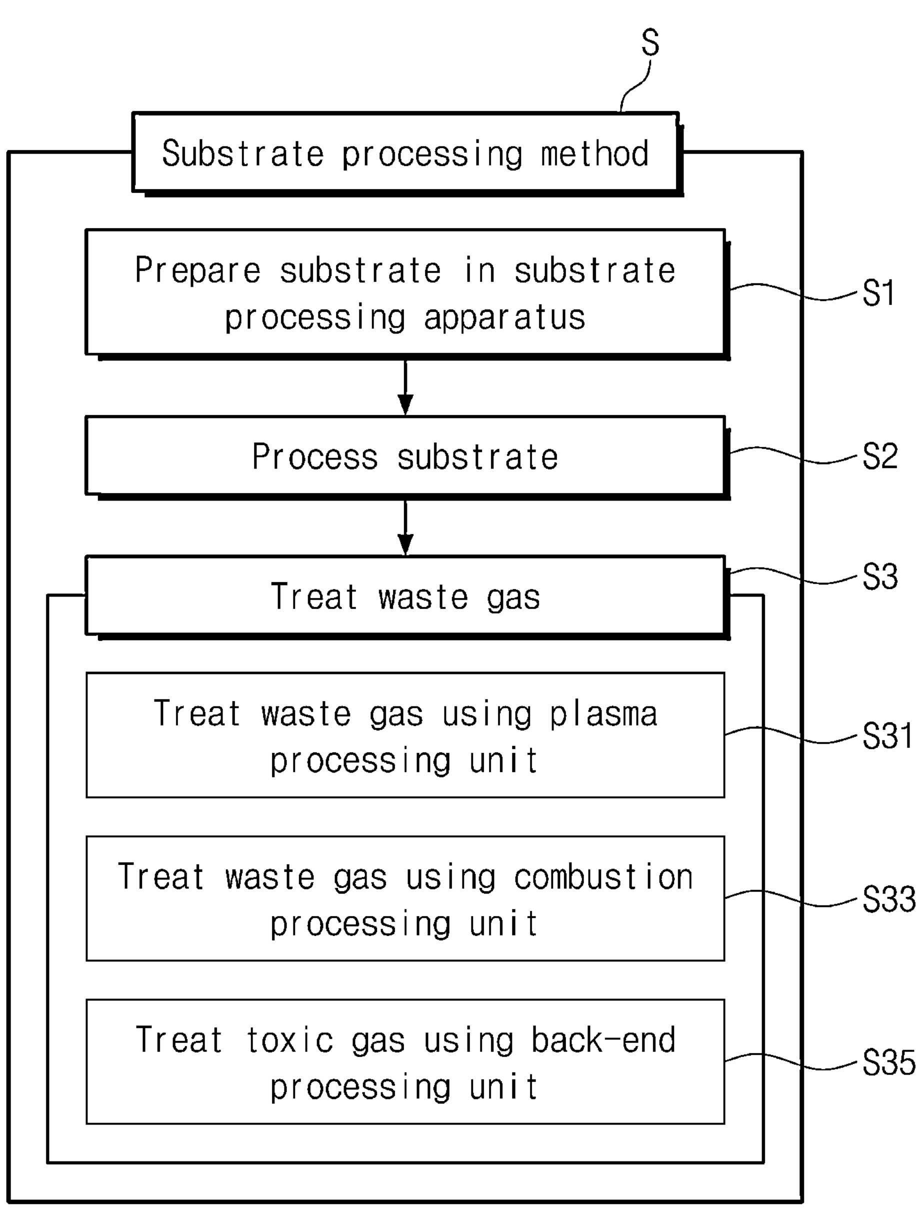
FIG. 7 is a flow chart illustrating a substrate processing method according to an embodiment of the inventive concept.

FIG. 7 is a flow chart illustrating a substrate processing method according to an embodiment of the inventive concept.

Referring to FIG. 7, a substrate processing method S may be provided. The substrate processing method S may be a method of processing a substrate using the substrate processing system described with reference to FIGS. 1 to 6. The substrate processing method S may include preparing a substrate in a substrate processing apparatus (in S1), processing the substrate (in S2), and treating a waste gas (in S3).

The treatment of the waste gas (in S3) may include treating the waste gas using a plasma processing unit (in S31), treating the waste gas using a combustion processing unit (in S33), and treating a toxic gas using a back-end processing unit (in S35).

Hereinafter, the substrate processing method S of FIG. 7 will be described in more detail with reference to FIGS. 8 to 13.

Figure 8:
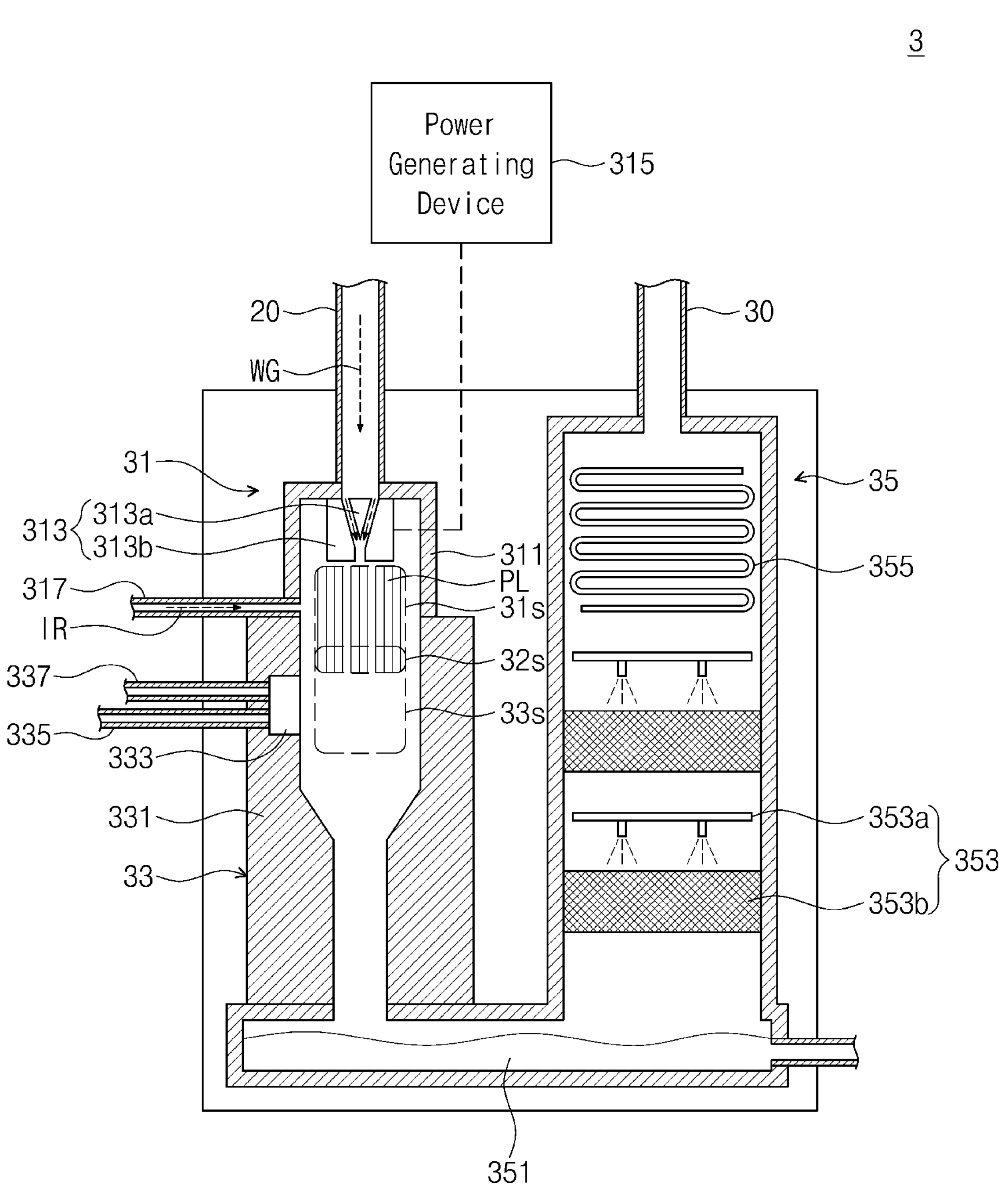
FIGS. 8 to 13 are diagrams illustrating a substrate processing method according to an embodiment of the inventive concept.
Figure 9:
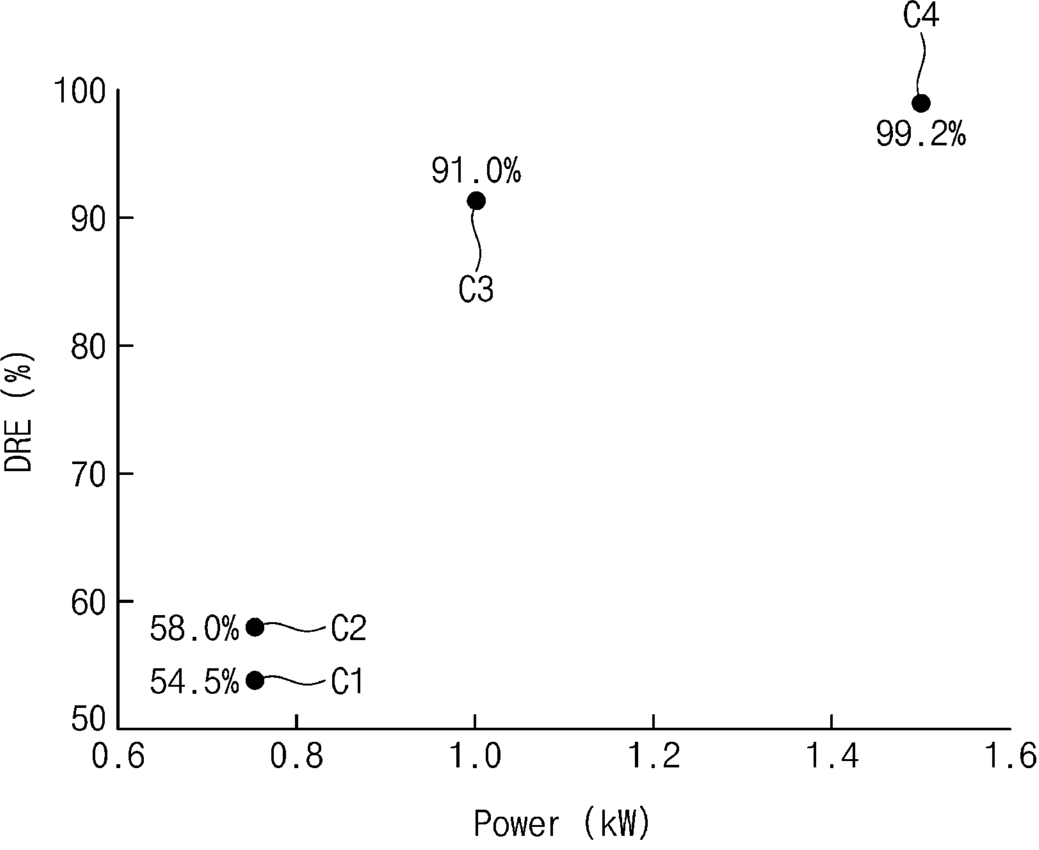
Figure 10:
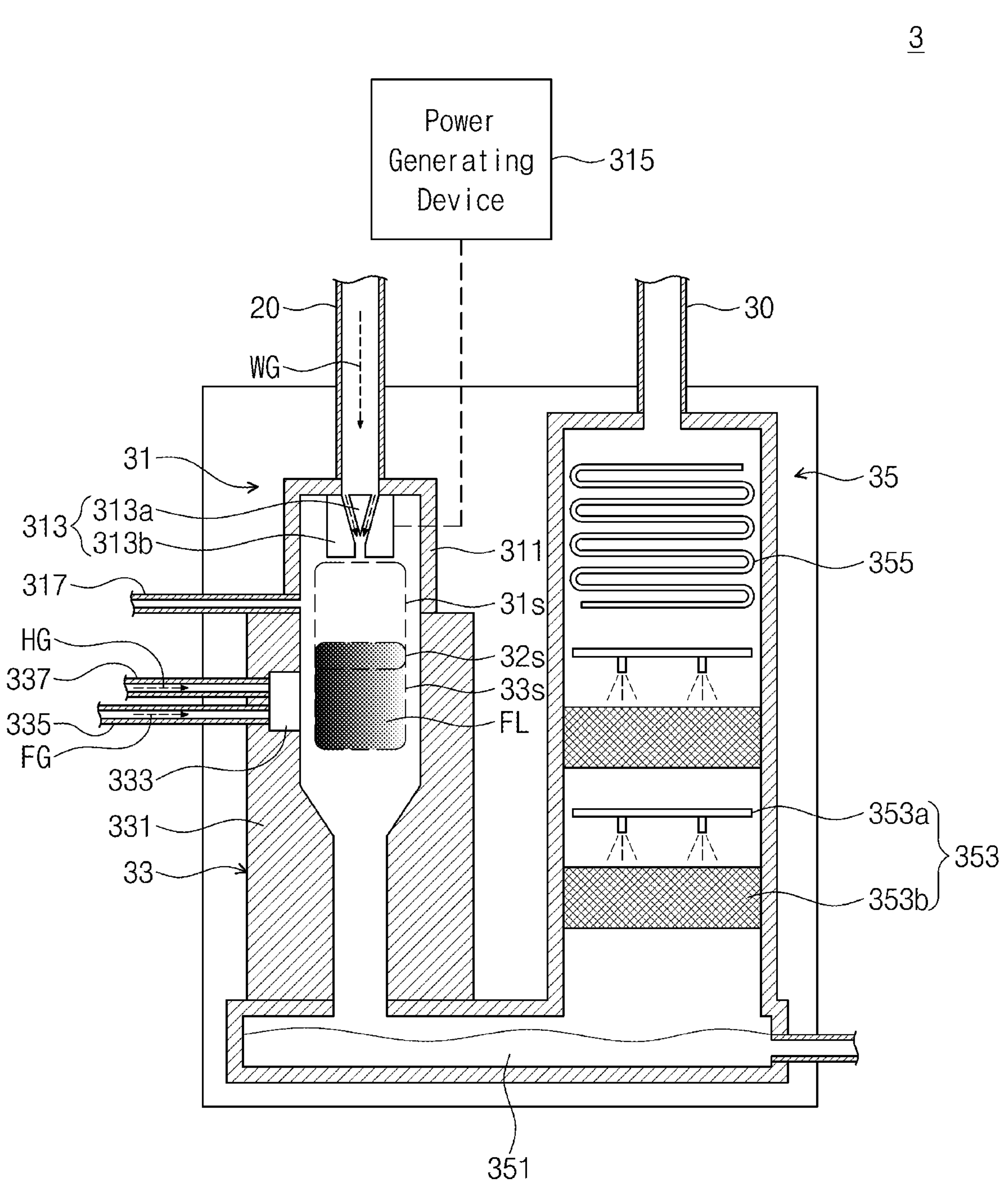
Figure 11:
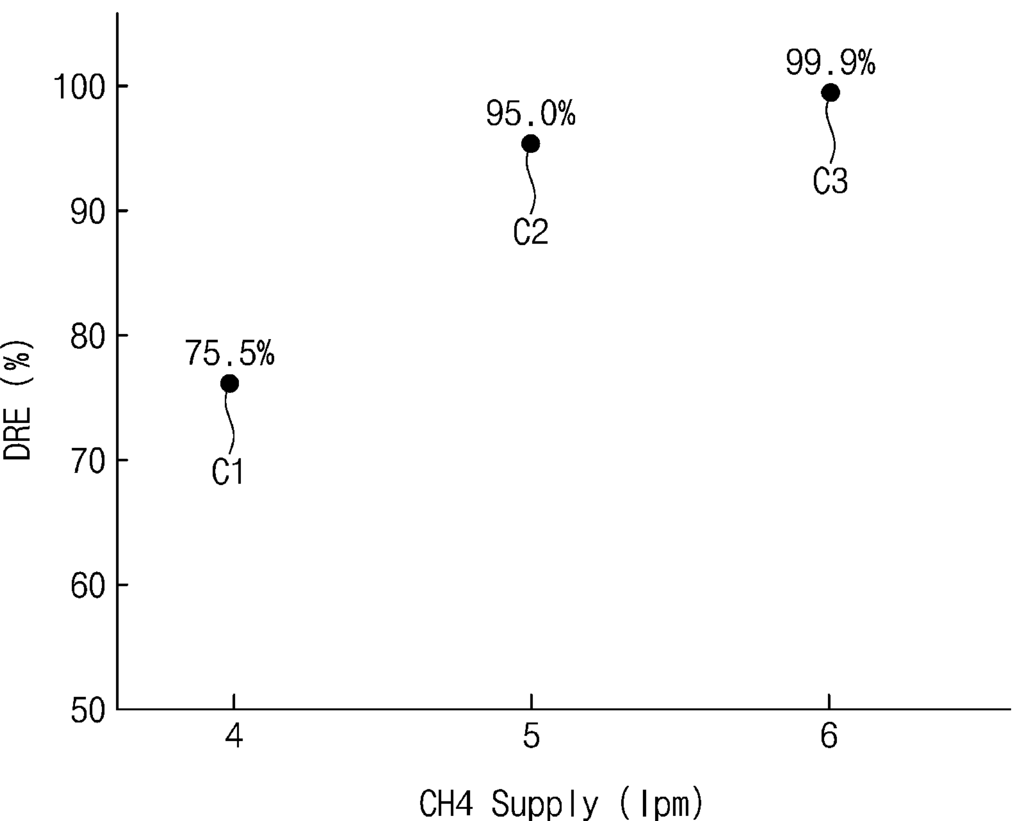
Figure 12:
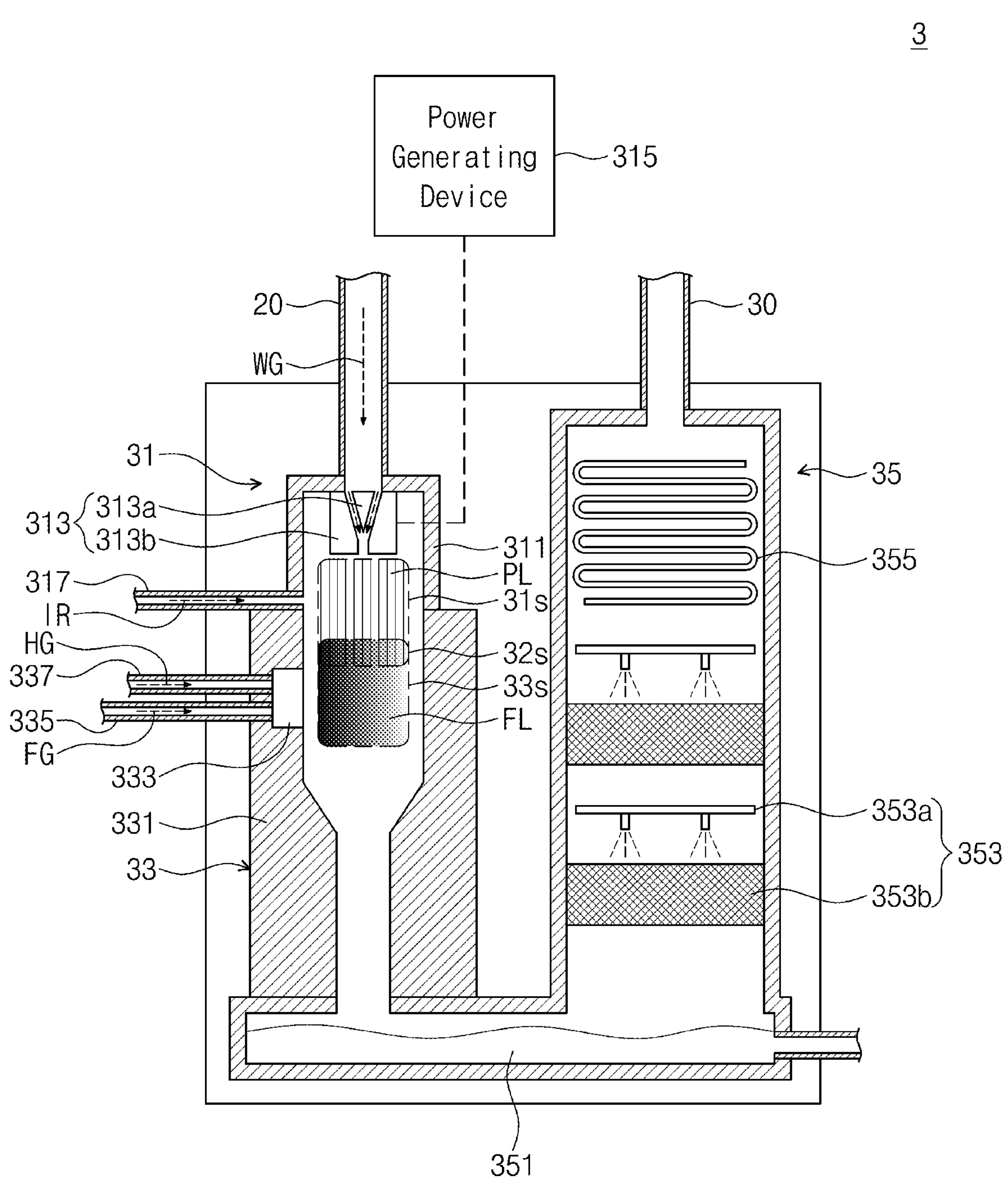
Figure 13:
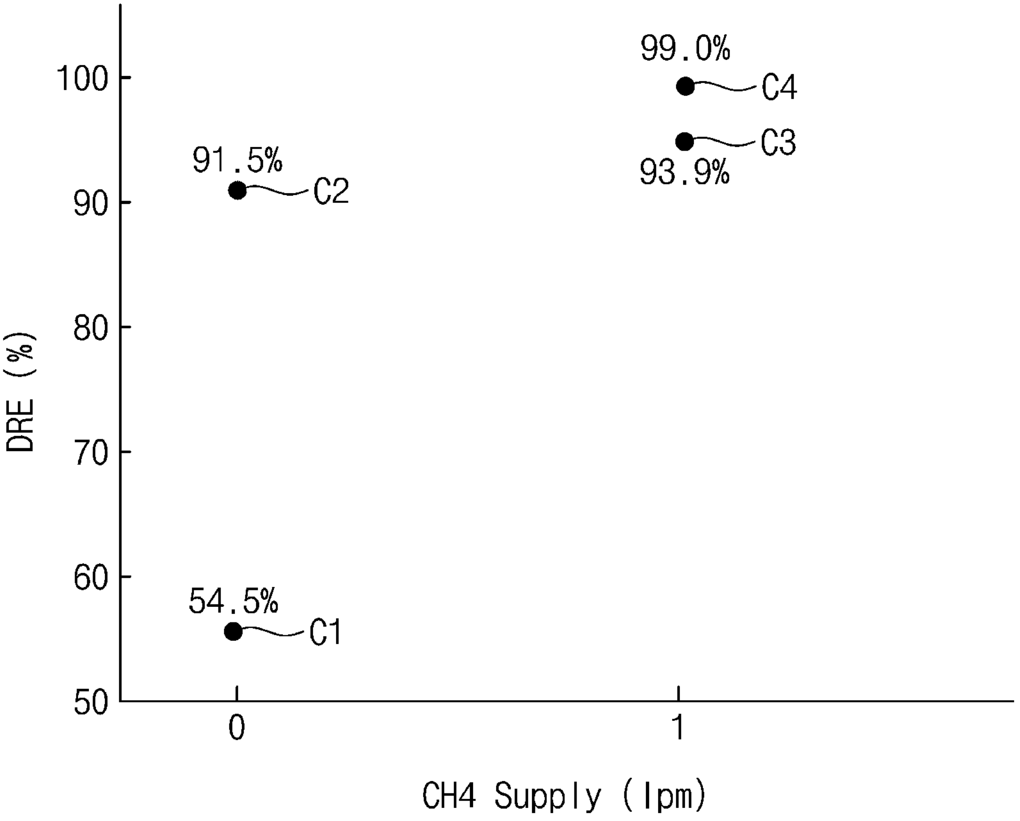

FIGS. 8 to 13 are diagrams illustrating a substrate processing method according to an embodiment of the inventive concept. FIGS. 8, 10, and 12 are sectional views illustrating a substrate processing method according to an embodiment of the inventive concept. FIGS. 9, 11, and 13 are graphs illustrating states of a scrubber according to an embodiment of the inventive concept.

Referring to FIGS. 4, 5, 6, and 7, the preparing of the substrate in the substrate processing apparatus (in S1) may include placing the substrate W in the substrate processing apparatus 1*a*, 1*b*, or 1*c*. For example, the substrate W may be disposed on the electrostatic chuck 43 of FIG. 3, the stage 55 of FIG. 4, or the cleaning stage 63 of FIG. 5.

The processing of the substrate (in S2) may include performing a semiconductor fabrication process on the substrate W and producing waste gas. For example, the semiconductor fabrication process may include an etching process performed by the substrate processing apparatus 1*a* of FIG. 4, a deposition process performed by the substrate processing apparatus 1*b* of FIG. 5, and a cleaning process performed by the substrate processing apparatus 1*c* of FIG. 6. However, the inventive concept is not limited to these examples.

The semiconductor fabrication process may be performed using a fluidic material supplied from the fluid supplying part GS. Waste gas may be produced from the fluidic material, which is used in the semiconductor fabrication process. The waste gas may be discharged to the vacuum pump 2 through the vacuum conduit 10.

Referring to FIGS. 7, 8, and 9, the treatment of the waste gas using the plasma processing unit (in S31) may include generating plasma PL using the plasma generating device 313, providing a recombination inhibitor IR, and decomposing the waste gas WG using the plasma PL and the recombination inhibitor IR.

The formation of the plasma PL using the plasma generating device 313 may include supplying electric power to the plasma generating device 313 using the power generating device 315 and forming the plasma PL in the first reaction space 31*s*. The power generating device 315 may be configured to supply an electric power to the plasma generating device 313 in response to an electrical signal transmitted from the substrate processing apparatus 1 of FIG. 1. For example, if the semiconductor fabrication process is started in the substrate processing apparatus 1 of FIG. 1, the power generating device 315 may supply the electric power to the plasma generating device 313 in response to an electrical signal received. If the semiconductor fabrication process in the substrate processing apparatus 1 is finished, the power generating device 315 may interrupt the electric power, which is supplied to the plasma generating device 313, in response to an electrical signal received. The substrate processing apparatus 1 of FIG. 1 may be configured to control the power generating device 315.

The plasma generating device 313 may generate the plasma PL in the first reaction space 31*s* using the electric power supplied from the power generating device 315. For example, the plasma PL, which is generated by the plasma generating device 313, may include at least one of arc plasma, gliding arc plasma, dielectric barrier discharge plasma, microwave plasma, pulsed corona discharge plasma, inductively coupled plasma, or capacitively coupled plasma, but the inventive concept is not limited to these examples.

The recombination inhibitor IR may be supplied through the inhibitor supplying pipe 317. The inhibitor supplying pipe 317 may be connected to the first reaction space 31*s*. For example, the recombination inhibitor IR may be supplied to the first reaction space 31*s* through the inhibitor supplying pipe 317. In an embodiment, the recombination inhibitor IR may include at least one of steam ($H_2O$) or hydrogen ($H_2$).

The plasma generating device 313 may generate the plasma PL from a portion of the waste gas WG supplied through the connection conduit 20. The plasma PL may be used to increase the reactivity of the waste gas WG. In the case where the reactivity of the waste gas WG is increased, the bonding structure between atoms may be broken or decomposed, and in this case, the atoms may be easily coupled with the recombination inhibitor IR. Thus, the waste gas WG may be decomposed, and a toxic gas may be produced. For example, the waste gas WG may be decomposed using the plasma PL and the recombination inhibitor IR. In an embodiment, the toxic gas may include nitrogen oxide ($NO_x$).

In an embodiment, the waste gas WG may include nitrogen trifluoride ($NF_3$), and the recombination inhibitor IR may include steam ($H_2O$). Depending on a level of electric power and an amount of the recombination inhibitor IR supplied to the plasma generating device 313, the scrubber 3 may have first to fourth states C1, C2, C3, and C4. In the first state C1 of the scrubber 3, the electric power supplied to the plasma generating device 313 may be about 0.75 kW, and a ratio between the number of fluorine (F) atoms in the waste gas WG and the number of hydrogen (H) atoms in the recombination inhibitor IR may be 1:2. In this case, the destruction and removal efficiency (DRE) of the waste gas WG may be about 54.5%. In the second state C2 of the scrubber 3, the electric power supplied to the plasma generating device 313 may be about 0.75 KW, and the ratio between the number of fluorine (F) atoms in the waste gas WG and the number of hydrogen (H) atoms in the recombination inhibitor IR may be 1:3. In this case, the DRE of the waste gas WG may be about 58.0%. In the third state C3 of the scrubber 3, the electric power supplied to the plasma generating device 313 may be about 1.0 kW, and the ratio between the number of fluorine (F) atoms in the waste gas WG and the number of hydrogen (H) atoms in the recombination inhibitor IR may be 1:3. In this case, the DRE of the waste gas WG may be about 91%. In the fourth state C4 of the scrubber 3, the electric power supplied to the plasma generating device 313 may be about 1.5 kW, and the ratio between the number of fluorine (F) atoms in the waste gas WG and the number of hydrogen (H) atoms in the recombination inhibitor IR may be 1:3. In this case, the DRE of the waste gas WG may be about 99.2%.

For example, in the case where the electric power supplied to the plasma generating device 313 is increased or the ratio between the number of fluorine (F) atoms in the waste gas WG and the number of hydrogen (H) atoms in the recombination inhibitor IR is increased, the DRE of the waste gas WG may be increased. In addition, since the water ($H_2O$) in a gaseous or liquid state and the hydrogen ($H_2$) are used in the plasma processing unit 31, only a tiny amount of nitrogen oxide ($NO_x$) may be exhausted.

Referring to FIGS. 7, 10, and 11, the treatment of the waste gas using the combustion processing unit (in S33) may include forming a flame FL using the combustor 333 and performing a combustion and/or thermolysis process on the waste gas WG using the flame FL. The forming of the flame FL using the combustor 333 may include supplying fuel FG into the combustor 333, supplying the air HG into the combustor 333, and forming the flame FL in the second reaction space 33*s*. The fuel FG may be supplied from the fuel supplying pipe 335 to the combustor 333. The air HG may be supplied from the air supplying pipe 337 to the combustor 333. For example, the fuel FG may include liquefied natural gas (LNG) and methane ($CH_4$) and may include a non-hydrocarbon material (e.g., hydrogen ($H_2$) and/or ammonia ($NH_3$)). The air HG may include oxygen ($O_2$). The combustor 333 may be configured to produce the flame FL in the second reaction space 33*s* using the fuel FG and the air HG.

The waste gas WG may be supplied through the connection conduit 20. The flame FL in the combustor 333 may be used to combust and pyrolyze the waste gas WG. The waste gas WG may be combusted and/or pyrolyzed and may be coupled with the air HG and the fuel FG. Thus, toxic gas may be produced from the waste gas WG. For example, the toxic gas may include nitrogen oxide ($NO_x$) and/or carbon monoxide (CO).

In an embodiment, the waste gas WG may include nitrogen trifluoride ($NF_3$), the fuel FG may include methane ($CH_4$), and the air HG may include oxygen ($O_2$). The scrubber 3 may have first to third states C1, C2, and C3, depending on the amount of the fuel FG. In the first state C1 of the scrubber 3, the amount of the fuel FG supplied to the combustor 333 may be about 4 liters per minute (lpm). In this case, the DRE of the waste gas WG may be about 75.5%. In the second state C2 of the scrubber 3, the amount of the fuel FG supplied to the combustor 333 may be about 5 lpm. In this case, the DRE of the waste gas WG may be about 95.0%. In the third state C3 of the scrubber 3, the amount of the fuel FG supplied to the combustor 333 may be about 6 lpm. In this case, the DRE of the waste gas WG may be about 99.9%. As the fuel FG supplied to the combustor 333 increases, the DRE of the waste gas WG may increase.

Referring to FIGS. 7, 12, and 13, the treatment of the waste gas (in S3) may include treating the waste gas WG using the plasma and combustion processing units 31 and 33. For example, the treatment of the waste gas using the plasma processing unit (in S31) and the treatment of the waste gas using the combustion processing unit (in S33) may be performed at the same time. In this case, a portion of the waste gas WG in the mixed reaction space 32*s* may be treated by the plasma PL and the flame FL. Alternatively, as described with reference to FIG. 3, the waste gas WG may be treated by the plasma processing unit 31, and the waste gas WG may be treated by the combustion processing unit 33.

In an embodiment, the waste gas WG may include nitrogen trifluoride ($NF_3$), the recombination inhibitor IR may include steam ($H_2O$), the fuel FG may include methane ($CH_4$), and the air HG may include oxygen ($O_2$). Depending on the magnitude of electric power, the amount of the recombination inhibitor IR, and the amount of the fuel FG supplied to the plasma generating device 313, the scrubber 3 may have first to fourth states C1, C2, C3, and C4. In the first state C1 of the scrubber 3, the electric power supplied to the plasma generating device 313 may be about 1.0 kW. In this case, the DRE of the waste gas WG may be about 54.5%. In the second state C2 of the scrubber 3, the electric power supplied to the plasma generating device 313 may be about 1.0 kW, and the ratio between the number of fluorine (F) atoms in the waste gas WG and the number of hydrogen (H) atoms in the recombination inhibitor IR may be 1:2. In this case, the DRE of the waste gas WG may be about 91.5%. In the third state C3 of the scrubber 3, the electric power supplied to the plasma generating device 313 may be about 1.0 kW, the ratio between the number of fluorine (F) atoms in the waste gas WG and the number of hydrogen (H) atoms in the recombination inhibitor IR may be 1:2, and the amount of the fuel FG supplied to the combustor 333 may be about 1 lpm. In this case, the DRE of the waste gas WG may be about 93.9%. In the fourth state C4 of the scrubber 3, the electric power supplied to the plasma generating device 313 may be about 1.2 kW, the ratio between the number of fluorine (F) atoms in the waste gas WG and the number of hydrogen (H) atoms in the recombination inhibitor IR may be 1:2, and the amount of the fuel FG supplied to the combustor 333 may be about 1 lpm. In this case, the DRE of the waste gas WG may be about 99.0%.

For example, if the electric power supplied to the plasma generating device 313 is increased, the ratio between the number of fluorine (F) atoms in the waste gas WG and the number of hydrogen (H) atoms in the recombination inhibitor IR is increased, or the amount of the fuel FG supplied to the combustor 333 is increased, the DRE of the waste gas WG may be increased. In this case, if both of the plasma and combustion processing units 31 and 33 are used, the electric power, which is supplied to the plasma generating device 313, and the amount of the fuel FG, which is supplied to the combustor 333, may be relatively reduced.

Referring back to FIGS. 7 to 13, the treatment of the toxic gas using the back-end processing unit (in S35) may include removing the toxic gas using at least one of the wet processing device 353 or the heat-exchanging cooling device 355. In an embodiment, a toxic gas may be highly soluble in cooling water, and in this case, the wet processing device 353 may be effectively used to remove the toxic gas. In an embodiment, the toxic gases may have a relatively high dew point temperature, and in this case, the toxic gases may be effectively removed by the heat-exchanging cooling device 355.

According to an embodiment of the inventive concept, the plasma generating device 313 of the scrubber 3 may be configured to easily generate plasma from the waste gas WG. Thus, the plasma generating device 313 may be operated with relatively low electric power (e.g., about 0.5 kW to about 15.0 kW). In addition, the generation of the plasma may be achieved without using any inert gas (e.g., argon (Ar) or nitrogen ($N_2$)). Thus, the treating of the waste gas WG may be easily achieved with reduced cost.

According to an embodiment of the inventive concept, the scrubber 3 may be configured to treat the waste gas WG using one of the plasma or combustion processing units 31 and 33 or to treat the waste gas WG using both the plasma and combustion processing units 31 and 33. The treatment of the waste gas (in S3) may include treating the waste gas WG using at least one of the plasma and combustion processing units 31 and 33. Thus, it may be possible to reduce the electric power and the amount of the fuel FG, which are required to treat the waste gas WG. Thus, the waste gas WG may be efficiently treated.

According to an embodiment of the inventive concept, a scrubber may be a hybrid scrubber including a plasma processing unit and a combustion processing unit. In addition, the plasma and combustion processing units may be configured to provide a first reaction space and a second reaction space which are partially overlapped with each other. Thus, the first reaction space may be used to treat a waste gas using the plasma, and the second reaction space may be used to treat the waste gas using a flame. In a mixed reaction space, which is an overlapping portion between the first and second reaction spaces, the waste gas may be treated using the plasma and the flame. Thus, depending on the kind of the waste gas, the waste gas may be efficiently treated using at least one of the plasma and/or the flame.

According to an embodiment of the inventive concept, a plasma generating device of a scrubber may be used to generate plasma using only a waste gas. Thus, the scrubber may be operated with a low electric power. In addition, an additional inert gas may not be needed to generate the plasma. Thus, it may be possible to reduce the costs required to treat the waste gas.

While example embodiments of the inventive concept have been particularly shown and described, it will be understood by one of ordinary skill in the art that variations in form and detail may be made therein without departing from the spirit and scope of the inventive concept.

What is claimed is:

1. A scrubber, comprising:

a plasma processing unit including a plasma generator;

a power supply;

a combustion processing unit including a combustor configured to form a flame;

a connection conduit configured to supply a waste gas to the plasma generator; and a back end processing unit connected to the combustion processing unit, wherein the plasma generator is configured to form plasma using the waste gas, and the plasma processing unit is configured to provide a first reaction space in which the plasma is formed, and the combustion processing unit is configured to provide a second reaction space in which the flame is formed.

2. The scrubber of claim 1, wherein a portion of the first reaction space and a portion of the second reaction space are overlapped with each other.

3. The scrubber of claim 1, wherein the first and second reaction spaces are spaced apart from each other.

4. The scrubber of claim 3, further comprising a baffle between the first and second reaction spaces.

5. The scrubber of claim 1, wherein the plasma generator comprises a first electrode and a second electrode, which are spaced apart from each other, and wherein the waste gas is transferred into a space between the first electrode and the second electrode.

6. The scrubber of claim 1, further comprising:

an inhibitor supply pipe provided between the plasma generator and the combustor and used to supply a recombination inhibitor, and wherein the combustion processing unit comprises an air supply pipe and a fuel supply pipe which are connected to the combustor.

7. The scrubber of claim 1, wherein the back end processing unit comprises at least one of a wet processing device and a heat-exchanging cooling device.

8. The scrubber of claim 1, wherein the plasma generator comprises at least one of an arc plasma device, a gliding arc plasma device, a dielectric barrier discharge plasma device, a microwave plasma device, a pulsed corona discharge plasma device, an inductively coupled plasma device, and a capacitively coupled plasma device.

9. A substrate processing system, comprising:

a substrate processing apparatus;

a vacuum pump connected to the substrate processing apparatus;

a scrubber connected to the vacuum pump;

a vacuum conduit connecting the substrate processing apparatus to the vacuum pump; and a connection conduit connecting the vacuum pump to the scrubber, wherein the scrubber comprises:

a plasma processing unit connected to the connection conduit, and comprising a plasma generator configured to generate plasma; and a combustion processing unit comprising a combustor, which is configured to produce a flame, wherein the scrubber is configured to provide a first reaction space in which the plasma is generated, and a second reaction space in which the flame is produced, and wherein a portion of the first reaction space and a portion of the second reaction space are overlapped with each other, wherein the scrubber further comprises a power supply configured to supply electric power to the plasma generator, and wherein the power supply is connected to the substrate processing apparatus and is configured to receive an electrical signal from the substrate processing apparatus.

10. The substrate processing system of claim 9, wherein the scrubber further comprises:

an inhibitor supply pipe, which is placed between the plasma generator and the combustor and is configured to supply a recombination inhibitor; and at least one of a wet processing device and a heat-exchanging cooling device.

11. The substrate processing system of claim 9, wherein the substrate processing apparatus comprises at least one of a substrate etching apparatus, a substrate deposition apparatus, a substrate polishing apparatus, and a substrate cleaning apparatus.

12. A substrate processing method, comprising:

preparing a substrate in a substrate processing apparatus;

processing the substrate; and treating a waste gas exhausted from the substrate processing apparatus, wherein treating the waste gas is performed by a scrubber including a plasma generator and a combustor, wherein treating the waste gas comprises treating the waste gas using at least one of the plasma generator and the combustor, and wherein the plasma generator is configured to generate a plasma using the waste gas.

13. The substrate processing method of claim 12, wherein treating the waste gas comprises treating the waste gas simultaneously using both the plasma generator and the combustor.

14. The substrate processing method of claim 12, wherein treating the waste gas using the plasma generator comprises using a recombination inhibitor and a plasma to decompose the waste gas.

15. The substrate processing method of claim 14, wherein the recombination inhibitor comprises hydrogen (H), the waste gas comprises fluorine (F), and a ratio between the fluorine (F) and the hydrogen (H) ranges from 1:1 to 1:10.

16. The substrate processing method of claim 12, wherein treating the waste gas comprises:

treating the waste gas using the plasma generator, and then treating the waste gas using the combustor.

17. The substrate processing method of claim 12, wherein treating the waste gas comprises removing a toxic gas, which is produced from the waste gas, using a back-end processing unit, and wherein the back-end processing unit comprises at least one of a wet processing device and a heat-exchanging cooling device.

18. The substrate processing method of claim 12, wherein an electric power supplied to the plasma generator ranges from 0.5 kW to 15 kW.

19. The substrate processing method of claim 12, wherein the scrubber is configured to provide a first reaction space in which a plasma is generated, and a second reaction space in which a flame is produced, and wherein a portion of the first reaction space and a portion of the second reaction space are overlapped with each other.

* * * * *